United States Patent
Pyon et al.

(10) Patent No.: US 9,786,725 B2
(45) Date of Patent: Oct. 10, 2017

(54) ORGANIC LIGHT-EMITTING DIODE DISPLAY

(71) Applicant: Samsung Display Co., Ltd., Yongin-si, Gyeonggi-do (KR)

(72) Inventors: Chang Soo Pyon, Seongnam-si (KR); Seung Woo Sung, Incheon (KR)

(73) Assignee: Samsung Display Co., Ltd., Yongin-si, Gyeonggi-do (KR)

( * ) Notice: Subject to any disclaimer, the term of this patent is extended or adjusted under 35 U.S.C. 154(b) by 95 days.

(21) Appl. No.: 14/858,431

(22) Filed: Sep. 18, 2015

(65) Prior Publication Data

US 2016/0275857 A1 Sep. 22, 2016

(30) Foreign Application Priority Data

Mar. 18, 2015 (KR) .................. 10-2015-0037650

(51) Int. Cl.
*H01L 27/32* (2006.01)
*G09G 3/3233* (2016.01)

(52) U.S. Cl.
CPC ....... *H01L 27/3244* (2013.01); *G09G 3/3233* (2013.01); *G09G 2300/0426* (2013.01); *G09G 2300/0819* (2013.01); *G09G 2300/0842* (2013.01); *G09G 2300/0861* (2013.01); *G09G 2310/0262* (2013.01); *G09G 2320/043* (2013.01)

(58) Field of Classification Search
CPC . H01L 27/3244; G09G 3/3233; G09G 3/3208
USPC ...................................................... 345/214
See application file for complete search history.

(56) References Cited

U.S. PATENT DOCUMENTS

| | | | | |
|---|---|---|---|---|
| 6,781,320 B2 * | 8/2004 | Park | ..... | G09G 3/3233 315/169.1 |
| 2013/0257839 A1 * | 10/2013 | Hyeon | ..... | G06F 3/038 345/212 |
| 2014/0118232 A1 * | 5/2014 | Kim | ..... | H01L 27/124 345/82 |
| 2015/0207094 A1 * | 7/2015 | Hwang | ..... | H01L 51/5203 257/88 |

(Continued)

FOREIGN PATENT DOCUMENTS

| KR | 10-2012-0075040 A | 7/2012 |
|---|---|---|
| KR | 10-2014-0077002 A | 6/2014 |
| KR | 10-2014-0108023 A | 9/2014 |

*Primary Examiner* — Fred Tzeng
(74) *Attorney, Agent, or Firm* — Knobbe, Martens, Olson & Bear LLP

(57) ABSTRACT

An organic light-emitting diode (OLED) display is disclosed. In one aspect, the display includes a scan line formed over a substrate and configured to provide a scan signal. A data line crossing the scan line is configured to respectively provide a data voltage, and a driving voltage line crossing the scan line is configured to respectively provide a driving voltage. The display includes a switching transistor electrically connected to the scan line and the data line and including a drain electrode configured to output the data voltage. A driving transistor includes a driving gate electrode electrically connected to the drain electrode of the switching transistor. A contact hole is formed between the driving gate electrode and the data line, and the driving voltage line passes through the contact hole to be connected to a conductive layer.

20 Claims, 6 Drawing Sheets

(56) References Cited

U.S. PATENT DOCUMENTS

2016/0064700 A1* 3/2016 Pyon ................... H01L 27/3258
                                                      257/40
2016/0211273 A1* 7/2016 Moon ................... H01L 27/124
2016/0217746 A1* 7/2016 An ....................... G09G 3/3233

* cited by examiner

ORGANIC LIGHT-EMITTING DIODE DISPLAY

CROSS-REFERENCE TO RELATED APPLICATIONS

This application claims priority to and the benefit of Korean Patent Application No. 10-2015-0037650 filed in the Korean Intellectual Property Office on Mar. 18, 2015, the entire contents of which are incorporated herein by reference.

BACKGROUND

Field

The described technology generally relates to an organic light-emitting diode display.

Description of the Related Technology

An organic light-emitting diode (OLED) includes two electrodes and an organic emission layer disposed therebetween. Electrons injected from one electrode and holes injected from the other electrode are coupled with each other in the organic emission layer to form excitons that emit light.

These diodes are incorporated into displays that include a matrix of pixels and transistors that drive the OLEDs connected to storage capacitors. The transistors typically include a switching transistor and a driving transistor.

When gate electrodes do not overlap each other, parasitic capacitance generated between a data line and a driving gate electrode may not be shielded in a high-resolution and low-mask configuration, thereby degrading image quality.

The above information disclosed in this Background section is only for enhancement of understanding of the background of the invention and therefore it can contain information that does not constitute the prior art that is already known in this country to a person of ordinary skill in the art.

SUMMARY OF CERTAIN INVENTIVE ASPECTS

One inventive aspect relates to an organic light-emitting diode display for shielding parasitic capacitance between a data line and a driving gate electrode.

Another aspect is an organic light emitting device including: a substrate; a scan line formed on the substrate and transmitting a scan signal; a data line and a driving voltage line crossing the scan line and transmitting a data voltage and a driving voltage; a switching transistor connected to the scan line and the data line, and including a drain electrode for outputting the data voltage; and a driving transistor including a driving gate electrode connected to a drain electrode of the switching transistor, wherein the driving voltage line is connected to a conductive layer through a contact hole formed in a predetermined region from among a region between the driving gate electrode and the data line.

The organic light emitting device can further include a shield gate electrode formed on a same layer as the driving gate electrode of the driving transistor.

The driving voltage line can be connected to the shield gate electrode through a contact hole.

The driving voltage line formed in the contact hole can shield parasitic capacitance between the data line and the driving gate electrode.

The organic light emitting device can further include a shield channel formed on a same layer as a driving channel of the driving transistor.

The driving voltage line is connected to the shield channel through a contact hole.

The driving voltage line connected to the shield channel shields parasitic capacitance between the data line and the driving gate electrode of the driving transistor.

Another aspect is an organic light-emitting diode (OLED) display, comprising: a substrate; a scan line formed over the substrate and configured to provide a scan signal; a data line crossing the scan line and configured to provide a data voltage; a driving voltage line crossing the scan line and configured to provide a driving voltage; a switching transistor electrically connected to the scan line and the data line and including a drain electrode configured to output the data voltage; and a driving transistor including a driving gate electrode electrically connected to the drain electrode of the switching transistor, wherein a contact hole is formed between the driving gate electrode and the data line, and wherein the driving voltage line passes through the contact hole to be connected to a conductive layer.

In the above OLED display, the conductive layer comprises a shield gate electrode formed on the same layer as the driving gate electrode of the driving transistor.

In the above OLED display, the driving voltage line is farther from the substrate than the shield gate electrode.

In the above OLED display, a first portion of the driving voltage line formed inside the contact hole is configured to shield a parasitic capacitance formed between the data line and the driving gate electrode.

In the above OLED display, the width of the contact hole increases with distance from the shield gate electrode.

In the above OLED display, the driving voltage line includes a second portion connected to the first portion, and wherein the second portion is formed over the contact hole and has a trapezoid shape.

The above OLED display further comprises: a gate insulating layer formed over the substrate; and an interlayer insulating layer formed over the gate insulating layer, wherein the contact hole is formed in the interlayer insulating layer, and wherein the shield gate electrode is covered by the interlayer insulating layer.

In the above OLED display, the conductive layer comprises a shield channel formed on the same layer as a driving channel of the driving transistor.

The above OLED display further comprises: a gate insulating layer formed over the substrate; and an interlayer insulating layer formed over the gate insulating layer, wherein the contact hole is formed in the interlayer insulating layer, and wherein the shield channel is formed in and covered by the gate insulating layer.

Another aspect is an organic light-emitting diode (OLED) display, comprising: a substrate; a data line formed over the substrate and configured to provide a data voltage; a driving voltage line formed over the substrate and configured to provide a driving voltage; a driving transistor including a driving gate electrode electrically connected to the driving voltage line; and a conductive layer interposed between the substrate and the data line, wherein the driving voltage line is electrically connected to the conductive layer via a contact hole formed between the driving gate electrode and the data line.

In the above OLED display, a portion of the driving voltage line is formed in the contact hole and configured to shield a parasitic capacitance formed between the data line and the driving gate electrode.

In the above OLED display, the conductive layer includes a shield gate electrode formed on the same layer as the driving gate electrode, wherein the driving voltage line is directly connected to the shield gate electrode via the contact hole.

In the above OLED display, the shield gate electrode and the driving gate electrode are formed on the same layer.

In the above OLED display, the conductive layer includes a shield channel formed on the same layer as a driving channel of the driving transistor, wherein the driving voltage line is electrically connected to the shield channel via the contact hole.

In the above OLED display, the shield channel and the driving gate electrode are formed on different layers.

The above OLED display further comprises a gate insulating layer formed over the shield channel, wherein the driving gate electrode is formed over the gate insulating layer.

In the above OLED display, the contact hole is further formed in the gate insulating layer.

Another aspect is an organic light-emitting diode (OLED) display, comprising: a substrate; a data line formed over the substrate and configured to provide a data voltage; a driving voltage line formed over the substrate and configured to provide a driving voltage, wherein the driving voltage line includes a first portion and a second portion; a driving transistor including a driving channel and a driving gate electrode electrically connected to the driving voltage line; a shield gate electrode formed on the same layer as the driving gate electrode; and a shield channel formed on the same layer as the driving channel, wherein the first portion of the driving voltage line is connected to the shield gate electrode via a first contact hole, and wherein the second portion of the driving voltage line is connected to the shield channel via a second contact hole.

The above OLED display further comprises: a scan line formed over the substrate and configured to provide a scan signal; and a switching transistor electrically connected to the scan line and the data line and including a drain electrode configured to output the data voltage, wherein the driving gate electrode of the driving transistor is electrically connected to the drain electrode of the switching transistor.

In the above OLED display, the widths of the first and second contact holes become increases with distance from the shield gate electrode.

According to at least one of the disclosed embodiments, the shield gate electrode is formed on the same layer as the driving gate electrode of the driving transistor, and the driving voltage line is connected to the shield gate electrode, thereby shielding the parasitic capacitance generated between the data line and the driving gate electrode of the driving transistor.

Further, the shield channel can be formed on the same layer as the driving channel of the driving transistor, and the driving voltage line can be connected to the shield channel, and thus, the parasitic capacitance can be shielded between the data line and the driving gate electrode.

DETAILED DESCRIPTION OF CERTAIN INVENTIVE EMBODIMENTS

Figure 1:
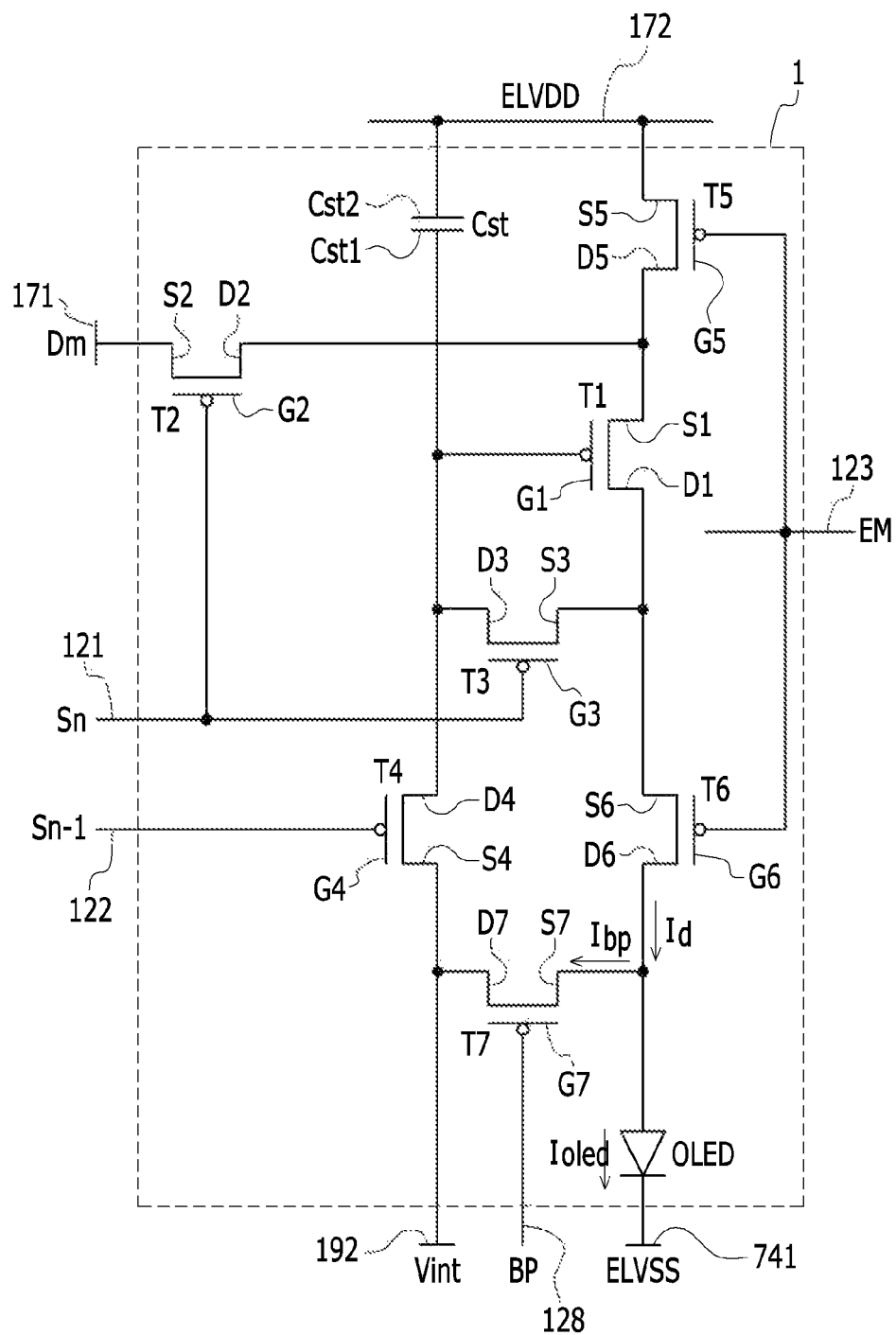
FIG. 1 shows an equivalent circuit diagram of a pixel of an OLED display according to an exemplary embodiment.

In the following detailed description, only certain exemplary embodiments have been shown and described, simply by way of illustration. As those skilled in the art would realize, the described embodiments can be modified in various different ways, all without departing from the spirit or scope of the described technology.

Parts that are unrelated to the description of the exemplary embodiments are not shown to make the description clear, and like reference numerals designate like elements throughout the specification.

The size and thickness of each component illustrated in the drawings are arbitrarily illustrated in the drawings for better understanding and ease of description, but the described technology is not limited to the illustrations.

In the drawings, the thicknesses of layers, films, panels, regions, etc., are exaggerated for clarity. The thicknesses of the layers, films, panels, regions, etc., are enlarged in the drawings for better understanding and ease of description. It will be understood that when an element such as a layer, film, region, or substrate is referred to as being "on" another element, it can be directly on the other element or intervening elements can also be present.

In addition, unless explicitly described to the contrary, the word "comprise" and variations such as "comprises" or "comprising" will be understood to imply the inclusion of stated elements but not the exclusion of any other elements. Throughout this specification, it is understood that the term "on" and similar terms are used generally and are not necessarily related to a gravitational reference.

Further, the term "in a plane view" means the case of viewing the object portion from the top, and the term "in a cross-sectional view" means the case of viewing a cross-section taken by vertically cutting the object portion from the side. In this disclosure, the term "substantially" includes the meanings of completely, almost completely or to any significant degree under some applications and in accordance with those skilled in the art. The term "connected" can include an electrical connection.

An organic light-emitting diode OLED display according to an exemplary embodiment will now be described with reference to FIG. 1 to FIG. 6.

FIG. 1 shows an equivalent circuit diagram of a pixel of an OLED display according to an exemplary embodiment.

As shown in FIG. 1, a pixel 1 of the OLED display includes a plurality of signal lines 121, 122, 123, 128, 171, 172, and 192, a plurality of transistors T1, T2, T3, T4, T5, T6, and T7 connected to the signal lines, a storage capacitor (Cst), and an organic light-emitting diode (OLED).

The transistors T1, T2, T3, T4, T5, T6, and T7 include a driving transistor T1, a switching transistor T2, a compensation transistor T3, an initialization transistor T4, an operation control transistor T5, an emission control transistor T6, and a bypass transistor T7.

The signal lines 121, 122, 123, 128, 171, 172, and 192 include a scan line 121 for transmitting a scan signal (Sn), a previous scan line 122 for transmitting a previous scan signal Sn−1 to the initialization transistor T4, an emission control line 123 for transmitting an emission control signal (EM) to the operation control transistor T5 and the emission control transistor T6, a bypass control line 128 for transmitting a bypass signal (BP) to the bypass transistor T7, a data line 171 crossing the scan line 121 and transmitting a data signal (Dm), a driving voltage line 172 for transmitting a driving voltage (ELVDD) and formed to be substantially parallel to the data line 171, and an initialization voltage line 192 for transmitting an initialization voltage (Vint) for initializing the driving transistor T1.

The driving transistor T1 includes a gate electrode G1 connected to a first terminal Cst1 of the storage capacitor Cst, a source electrode S1 connected to the driving voltage line 172 via the operation control transistor T5, and a drain electrode D1 electrically connected to an anode of the OLED via the emission control transistor T6. The driving transistor T1 receives a data signal (Dm) according to a switching operation of the switching transistor T2, and supplies a driving current (Id) to the OLED.

The switching transistor T2 includes a gate electrode G2 connected to the scan line 121, a source electrode S2 connected to the data line 171, and a drain electrode D2 connected to the source electrode S1 of the driving transistor T1 and connected to the driving voltage line 172 via the operation control transistor T5. The switching transistor T2 is turned on by the scan signal (Sn) transmitted through the scan line 121, and transmits the data signal (Dm) transmitted through the data line 171 to the source electrode of the driving transistor T1, and thus performs a switching operation.

The compensation transistor T3 includes a gate electrode G3 connected to the scan line 121, and a source electrode S3 connected to the drain electrode D1 and connected to the anode of the OLED via the emission control transistor T6. The compensation transistor T3 also includes a drain electrode D3 connected to the drain electrode D4, the first terminal Cst1, and the gate electrode G1. The compensation transistor T3 is turned on by the scan signal (Sn) provided through the scan line 121, and connects the gate electrode G1 and the drain electrode D1 of the driving transistor T1 to diode-connect the driving transistor T1.

The initialization transistor T4 includes a gate electrode G4 connected to a previous scan line 122, and a source electrode S4 connected to the initialization voltage line 192. The initialization transistor T4 also includes a drain electrode D4 connected to the first terminal. Cst1 and the gate electrode G1 via the drain electrode D3. The initialization transistor T4 is turned on by the previous scan signal Sn−1 provided through the previous scan line 122, and transmits the initialization voltage (Vint) to the gate electrode G1 of the driving transistor T1 to initialize a gate voltage at the gate electrode G1 of the driving transistor T1, thereby performing an initialization operation.

The operation control transistor T5 includes a gate electrode G5 connected to the emission control line 123, a source electrode S5 connected to the driving voltage line 172, and a drain electrode D5 connected to the source electrode S1 and the drain electrode S2.

The emission control transistor T6 includes a gate electrode G6 connected to the emission control line 123, and a source electrode S6 connected to the drain electrode D1 of the driving transistor T1 and the source electrode S3 of the compensation transistor T3. The emission control transistor T6 also includes a drain electrode D6 electrically connected to the anode of the OLED. The operation control transistor T5 and the emission control transistor T6 are turned on by the emission control signal (EM) provided through the emission control line 123, and the driving voltage (ELVDD) is compensated through the diode-connected driving transistor T1 and is then transmitted to the OLED.

The bypass transistor T7 includes a gate electrode G7 connected to the bypass control line 128, a source electrode S7 connected to the drain electrode D6 and the anode of the OLED, and a drain electrode D7 connected to the initialization voltage line 192 and the source electrode S4.

The storage capacitor Cst includes a second terminal Cst2 connected to the driving voltage line 172, and the OLED includes a cathode connected to a common voltage line 741 for transmitting a common voltage (ELVSS).

A detailed operation of a pixel of an OLED display according to an exemplary embodiment will now be described with reference to FIG. 2.

Figure 2:
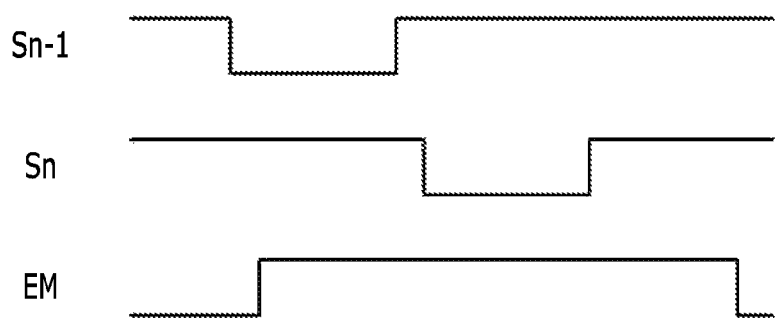
FIG. 2 shows a timing diagram of a signal applied to a pixel of an OLED display according to an exemplary embodiment.

FIG. 2 shows a timing diagram of a signal applied to a pixel of an OLED display according to an exemplary embodiment.

As shown in FIG. 2, during an initialization period, a low-level previous scan signal Sn−1 is supplied through the previous scan line 122. A low-level emission control signal (EM) is already applied through the emission control line 123. The initialization transistor T4 is turned on corresponding to the low-level previous scan signal Sn−1, the initialization voltage (Vint) is supplied to the gate electrode of the driving transistor T1 from the initialization voltage line 192 through the initialization transistor T4, and the driving transistor T1 is initialized by the initialization voltage (Vint).

During a data programming period, a low-level scan signal (Sn) is supplied through the scan line 121. The switching transistor T2 and the compensation transistor T3 are turned on corresponding to the low-level scan signal (Sn). The driving transistor T1 is diode connected by the turned-on compensation transistor T3 and is biased in a forward direction.

A compensation voltage (Dm+Vth, where Vth has a negative (−) value) reduced by a threshold voltage (Vth) of the driving transistor T1 from the data signal (Dm) provided by the data line 171 is applied to the gate electrode G1 of the driving transistor T1

The driving voltage (ELVDD) and the compensation voltage (Dm+Vth) are applied to respective ends of the storage capacitor Cst, and charges corresponding to a voltage difference between the ends are stored in the storage capacitor Cst.

During an emission period, the emission control signal (EM) supplied through the emission control line 123 is changed to low-level from high-level. During the emission period, the operation control transistor T5 and the emission control transistor T6 are turned on by the low-level emission control signal (EM).

The driving current (Id) caused by the voltage difference between the gate voltage at the gate electrode G1 and the driving voltage (ELVDD) is generated and supplied to the OLED through the emission control transistor T6. During the emission period, a gate-source voltage (Vgs) of the driving transistor T1 is maintained at (Dm+Vth)-ELVDD by the storage capacitor Cst. Considering the current-voltage relationship of the driving transistor T1, the driving current (Id) is proportional to the value of $(Dm-ELVDD)^2$, that is, the square of a subtraction of the threshold voltage from the source-gate voltage. Therefore, the driving current (Id) is determined irrespective of the threshold voltage (Vth) of the driving transistor T1.

The bypass transistor T7 receives a bypass signal (BP) from the bypass control line 128. The bypass signal (BP) is a voltage with a predetermined level for turning off the bypass transistor T7, and the bypass transistor T7 receives a transistor-turning-off-level voltage through the gate electrode G7 to turn off the bypass transistor T7, and while the same is turned off, part of the driving current (Id) goes through the bypass transistor T7 as a bypass current (Ibp).

When the minimum current of the driving transistor T1 for displaying a black image flows as a driving current and the OLED emits light, the black image is not normally displayed. Therefore, the bypass transistor T7 of the OLED display according to an exemplary embodiment can divide part of the minimum current of the driving transistor T1 toward a current path that is different from the current path on the side of the OLED as the bypass current (Ibp). The minimum current of the driving transistor T1 in this instance signifies the current under a condition in which a gate-source voltage (Vgs) of the driving transistor T1 is less than a threshold voltage (Vth) and the driving transistor T1 is turned off. The minimum driving current (e.g., a current that is less than about 10 pA) in the condition of turning off the driving transistor T1 is transmitted to the OLED and is expressed as an image with black luminance. When the minimum driving current for displaying the black image flows, an influence of a roundabout transfer of the bypass current (Ibp) is high, and when a high driving current for displaying an image such as a general image or a white image flows, the influence of the bypass current (Ibp) seems very small. Therefore, when the driving current for displaying the black image flows, an emission current (Ioled) of the OLED reduced by a current amount of the bypass current (Ibp) passing through the bypass transistor T7 from the driving current (Id) has the minimum current amount that can express the black image. A contrast ratio can be improved by using the bypass transistor T7 and realizing the accurate black luminance image. Referring to FIG. 2, the bypass signal (BP) corresponds to a next scan signal Sn+1, but is not limited thereto. The configuration of seven transistors and one capacitor including the bypass transistor T7 has been described in an exemplary embodiment, but the described technology is not limited thereto, and the number of transistors and the number of capacitors are modifiable in various ways.

A detailed configuration of an OLED display according to an exemplary embodiment will now be described with reference to FIG. 3 to FIG. 6.

Figure 3:
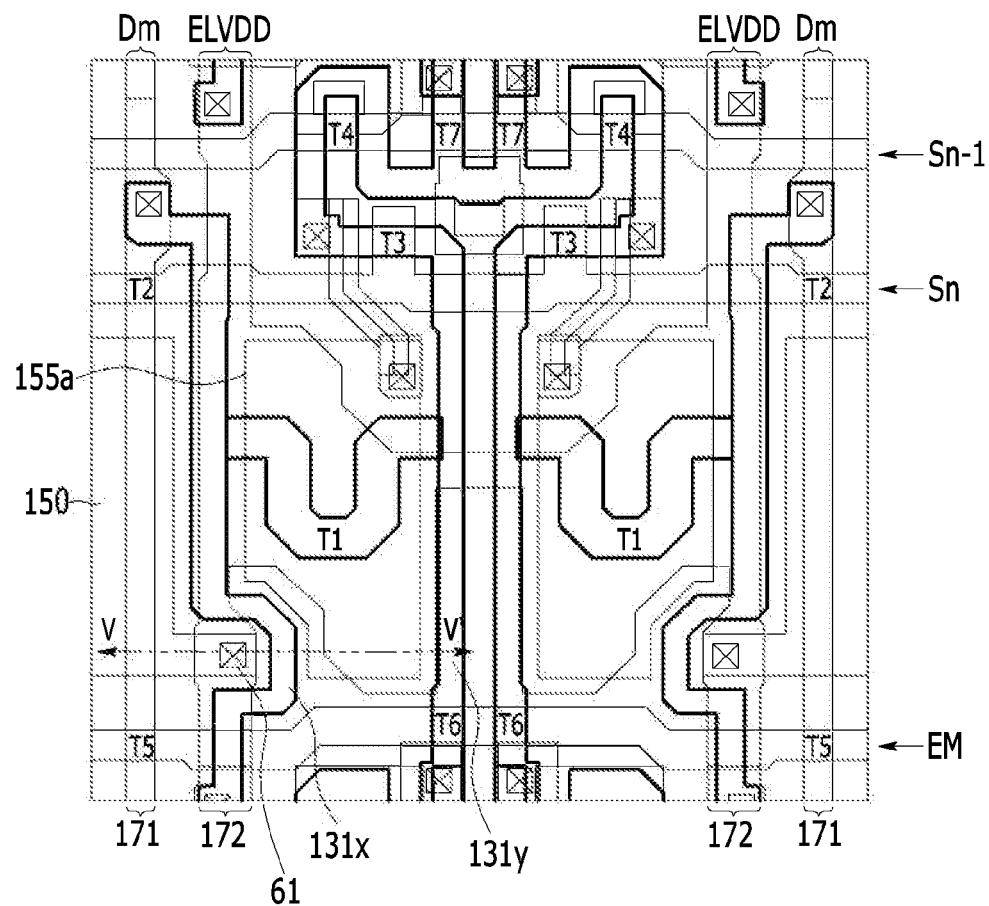
FIG. 3 shows a plurality of transistors and capacitors of an OLED display according to a first exemplary embodiment.

FIG. 3 shows a plurality of transistors and capacitors of an OLED display according to a first exemplary embodiment.

As shown in FIG. 1 and FIG. 3, the OLED display includes a scan line 121, a previous scan line 122, an emission control line 123, and a bypass control line 128 for applying a scan signal (Sn), a previous scan signal Sn−1, an emission control signal (EM), and a bypass signal (BP) and formed in a row direction, and it includes a data line 171 and a driving voltage line 172 crossing the scan line 121, the previous scan line 122, the emission control line 123, and the bypass control line 128 and applying a data signal (Dm) and a driving voltage (ELVDD) to a pixel. The initialization voltage (Vint) is transmitted to the compensation transistor T3 through the initialization voltage line 192.

A driving transistor T1, a switching transistor T2, a compensation transistor T3, an initialization transistor T4, an operation control transistor T5, an emission control transistor T6, a bypass transistor T7, a storage capacitor Cst, and an OLED are formed in the pixel. The OLED includes a pixel electrode (not shown), an organic emission layer (not shown), and a common electrode (not shown).

Respective channels of the driving transistor T1, the switching transistor T2, the compensation transistor T3, the initialization transistor T4, the operation control transistor T5, the emission control transistor T6, and the bypass transistor T7 are formed inside the connected semiconductor, and the semiconductor can be formed to be bent in various ways. The semiconductor can be formed of a polycrystalline semiconductor material or an oxide semiconductor material. The oxide semiconductor material can include any one oxide based on titanium (Ti), hafnium (Hf), zirconium (Zr), aluminum (Al), tantalum (Ta), germanium (Ge), zinc (Zn), gallium (Ga), tin (Sn), or indium (In), and indium-gallium-zinc oxide (InGaZnO4), indium-zinc oxide (Zn—In—O), zinc tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), or hafnium-indium-zinc oxide (Hf—In—Zn—O) which are compound oxides thereof. When the semiconductor layer is formed of the oxide semiconductor, a separate passivation layer can be added in order to protect the oxide semiconductor that is vulnerable to an external environment such as a high temperature.

The semiconductor includes a channel which is doped with a N-type impurity or a P-type impurity, and a source doping portion and a drain doping portion which are formed at respective sides of the channel and are doped with more impurities than the impurity which is doped in the channel. In the present exemplary embodiment, the source doping portion and the drain doping portion correspond to the source electrode and the drain electrode, respectively. The source electrode and the drain electrode formed in the semiconductor can be formed by doping the impurity only in a corresponding region. Further, in the semiconductor, a region between the source electrode and the drain electrode of different transistors is doped so that the source electrode and the drain electrode can be electrically connected to each other.

A cross-sectional structure of an OLED display according to an exemplary embodiment will now be described in detail with reference to FIG. 4.

Figure 4:
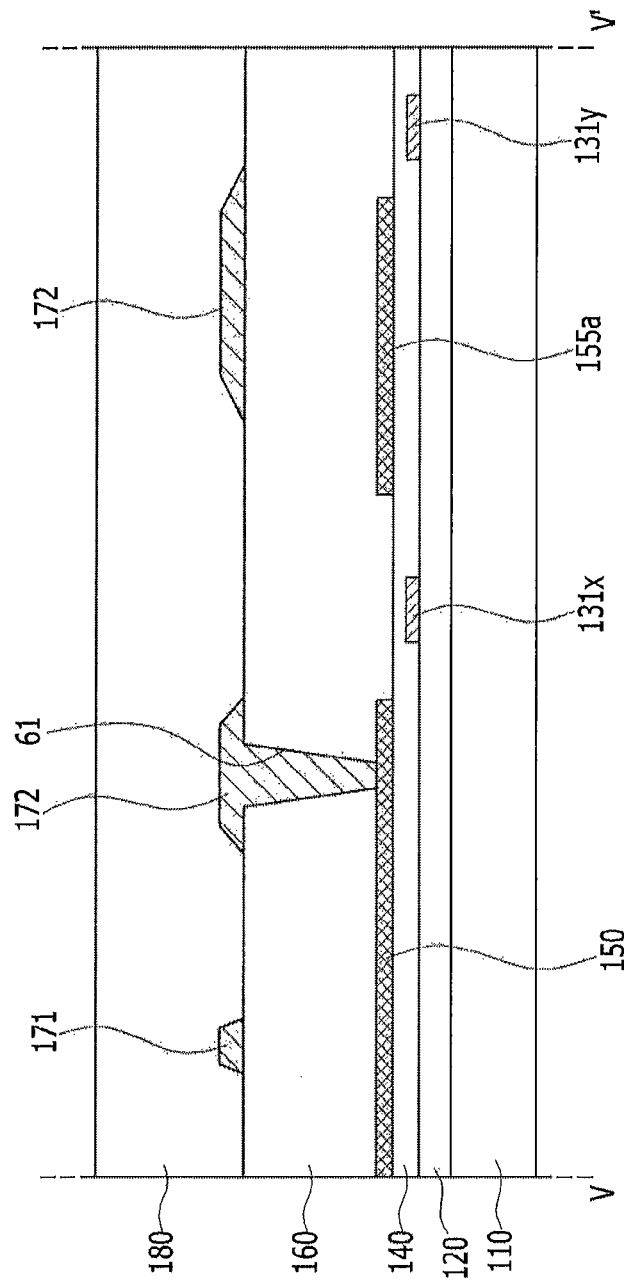
FIG. 4 shows a cross-sectional view of an OLED display of FIG. 3 with respect to a line V-V'.

FIG. 4 shows a cross-sectional view of an OLED display of FIG. 3 with respect to a line V-V'.

As shown in FIG. 3 and FIG. 4, the OLED display shields parasitic capacitance between the data line 171 and the driving transistor T1 generated by the driving voltage line 172.

A buffer layer 120 is formed on a substrate 110. The substrate 110 can be formed of an insulating substrate made of glass, quartz, ceramic, or plastic. The buffer layer 120 can block an impurity from the substrate 110 in a crystallization process for forming a polycrystalline semiconductor to improve a characteristic of the polycrystalline semiconductor and reduce stress applied to the substrate 110.

Semiconductors 131x and 131y including a driving channel (not shown), a switching channel (not shown), a compensation channel (not shown), an initialization channel (not shown), an operation control channel (not shown), an emission control channel (not shown), and a bypass channel (not shown) can be formed on the buffer layer 120.

A gate insulating layer 140 for covering the semiconductors 131x and 131y is formed on the semiconductors 131x and 131y. A scan line 121 including a compensation gate electrode (not shown), a previous scan line 122 including an initialization gate electrode (not shown), an emission control line 123 including an operation control gate electrode (not shown) and an emission control gate electrode (not shown), and a gate wire including a driving gate electrode (first storage electrode) 155a are formed on the gate insulating layer 140. The gate insulating layer 140 can be formed with a silicon nitride (SiNx) or a silicon oxide (SiOx).

A second gate wire (not shown) including a storage line disposed in parallel with the scan line 121 and a second storage electrode (not shown) extending from the storage line can be formed on the gate insulating layer 140.

A shield gate electrode 150 formed on a same layer as the driving gate electrode 155a is formed on the gate insulating layer 140. The shield gate electrode 150 can be formed to overlap the data line 171. The shield gate electrode 150 can be formed to overlap part of the driving voltage line 172.

An interlayer insulating layer 160 is formed on the gate insulating layer 140. The interlayer insulating layer 160 can be formed with a silicon nitride (SiNx) or a silicon oxide (SiOx).

A contact hole is formed in the interlayer insulating layer 160. Data wires 171 and 172 including a data line 171, a driving voltage line 172, a first data connecting member (not shown), and a second data connecting member (not shown) are formed on the interlayer insulating layer 160.

A first contact hole 61 connected to the shield gate electrode 150 is formed in the interlayer insulating layer 160. The driving voltage line 172 is connected to the shield gate electrode 150 formed on the gate insulating layer 140 through the first contact hole 61.

The driving voltage line 172 formed in the first contact hole 61 shields parasitic capacitance between the data line 171 and the driving gate electrode 155a.

A passivation layer 180 is formed on the data wires 171 and 172 and the interlayer insulating layer 160 to cover the same. The passivation layer 180 can be formed of an organic layer.

Figure 5:
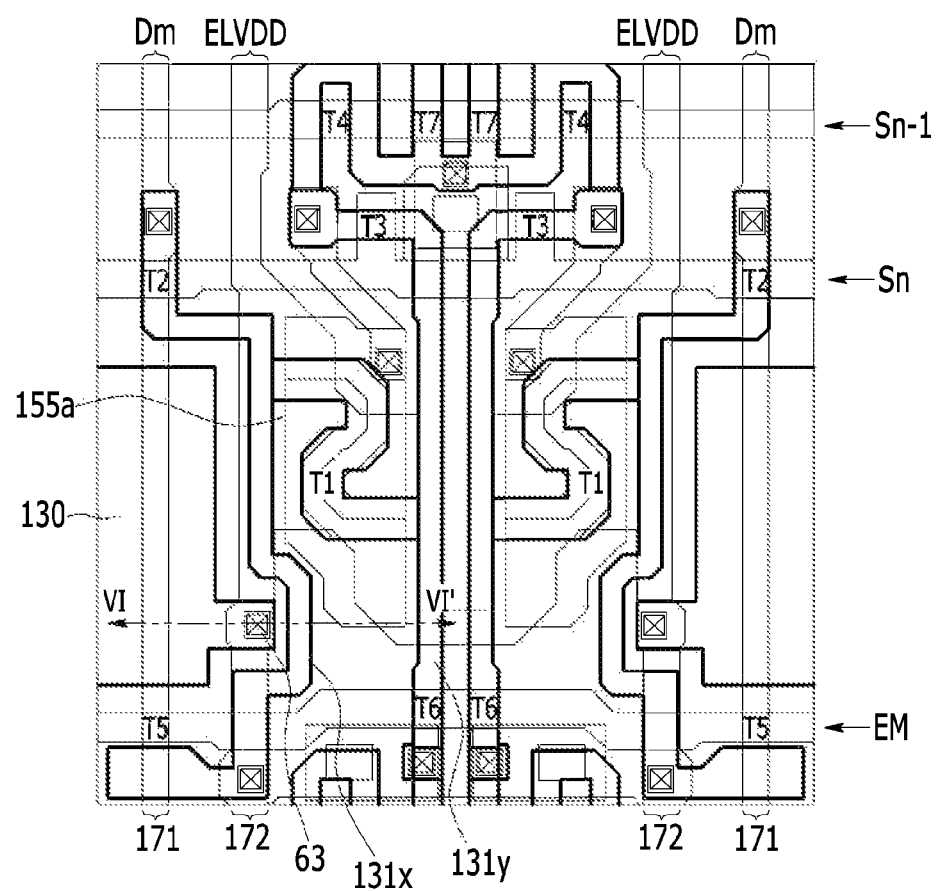
FIG. 5 shows a plurality of transistors and capacitors of an OLED display according to a second exemplary embodiment.
Figure 6:
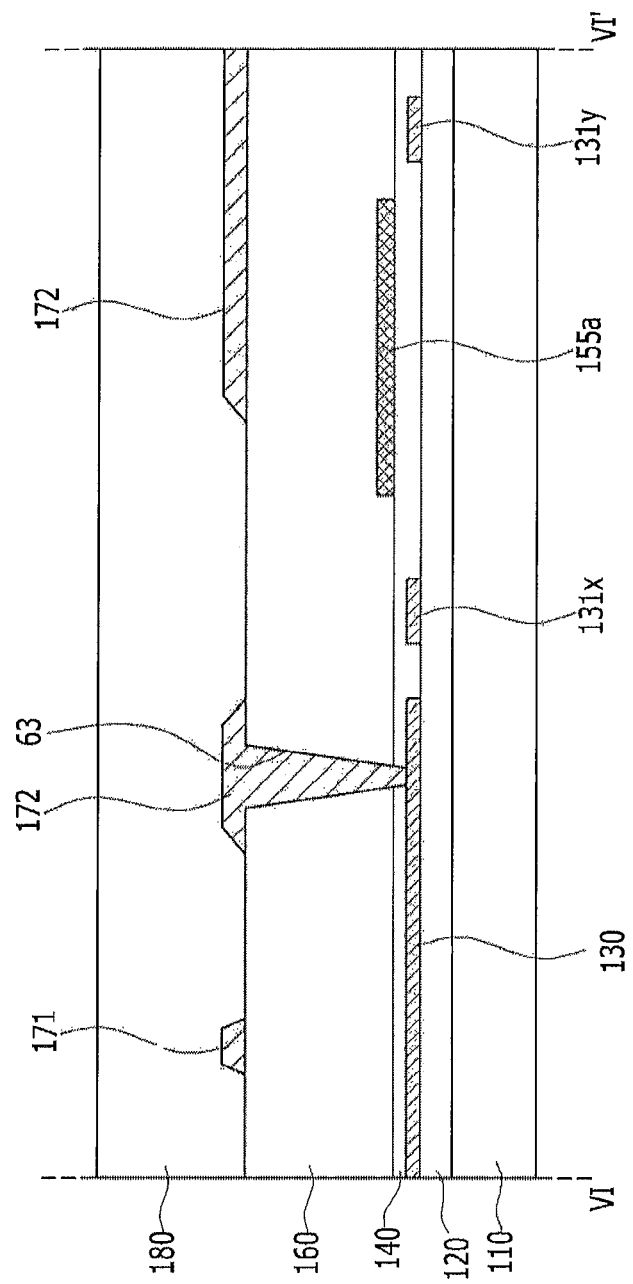
FIG. 6 shows a cross-sectional view of an OLED display of FIG. 5 with respect to a line VI-VI'.

FIG. 5 shows a plurality of transistors and capacitors of an OLED display according to a second exemplary embodiment. FIG. 6 shows a cross-sectional view of an OLED display of FIG. 5 with respect to a line VI-VI'.

Referring to FIG. 5 and FIG. 6, the OLED display further includes a shield channel 130 formed on a same layer as the driving channel of the driving transistor T1.

The shield channel 130 can be formed on the buffer layer 120, and can be formed on the same layer as the semiconductors 131x and 131y including a driving channel (not shown), a switching channel (not shown), a compensation channel (not shown), an initialization channel (not shown), an operation control channel (not shown), an emission control channel (not shown), and a bypass channel (not shown).

The shield channel 130 can be formed to overlap the data line 171. The shield channel 130 can be formed to overlap part of the driving voltage line 172. The shield gate electrode 150 of FIG. 4 and the shield channel 130 of FIG. 6 are conductive layers. Also, the conductive layer to which the driving voltage line is connected is not limited thereto.

A gate insulating layer 140 for covering the semiconductor is formed on the semiconductor. A gate wire including a driving gate electrode (first storage electrode) 155a is formed on the gate insulating layer 140. The gate insulating layer 140 can be formed of a silicon nitride (SiNx) or a silicon oxide (SiOx).

An interlayer insulating layer 160 is formed on the gate insulating layer 140. The interlayer insulating layer 160 can be formed of a silicon nitride (SiNx) or a silicon oxide (SiOx).

A second contact hole 63 connected to the shield channel 130 is formed on the interlayer insulating layer 160. The driving voltage line 172 is connected to the shield channel 130 formed on the buffer layer 120 through the second contact hole 63.

The driving voltage line 172 connected to the shield channel 130 shields parasitic capacitance between the data line 171 and the driving gate electrode 155a of the driving transistor T1.

According to at least one of the disclosed embodiments, the OLED display can form the shield gate electrode on the same layer as the driving gate electrode of the driving transistor, and connect the driving voltage line and the shield gate electrode to shield the parasitic capacitance generated between the data line and the driving gate electrode of the driving transistor.

Further, the OLED display can form the shield channel on the same layer as the driving channel of the driving transistor, and connect the driving voltage line and the shield channel to shield the parasitic capacitance generated between the data line and the driving gate electrode.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light-emitting diode (OLED) display, comprising:
   a substrate;
   a scan line formed over the substrate and configured to provide a scan signal;
   a data line crossing the scan line and configured to provide a data voltage;
   a driving voltage line crossing the scan line and configured to provide a driving voltage;
   a switching transistor electrically connected to the scan line and the data line and including a drain electrode configured to output the data voltage; and
   a driving transistor including a driving gate electrode electrically connected to the drain electrode of the switching transistor,
   wherein a contact hole is formed between the driving gate electrode and the data line, wherein the driving voltage line passes through the contact hole to be connected to a conductive layer, and
   wherein the conductive layer comprises a shield gate electrode or a shield channel located on a second side opposite a first side where the driving gate electrode is located with respect to the drive voltage line and extended along a direction in which the data line is extended.

2. The OLED display of claim 1, wherein the conductive layer comprises the shield gate electrode formed on the same layer as the driving gate electrode of the driving transistor.

3. The OLED display of claim 2, wherein the driving voltage line is farther from the substrate than the shield gate electrode.

4. The OLED display of claim 3, wherein a first portion of the driving voltage line formed inside the contact hole is configured to shield a parasitic capacitance formed between the data line and the driving gate electrode.

5. The OLED display of claim 4, wherein the width of the contact hole increases with distance from the shield gate electrode.

6. The OLED display of claim 5, wherein the driving voltage line includes a second portion connected to the first portion, and wherein the second portion is formed over the contact hole and has a trapezoid shape.

7. The OLED display of claim 3, further comprising:
a gate insulating layer formed over the substrate; and
an interlayer insulating layer formed over the gate insulating layer, wherein the contact hole is formed in the interlayer insulating layer, and wherein the shield gate electrode is covered by the interlayer insulating layer.

8. The OLED display of claim 1, wherein the conductive layer comprises the shield channel formed on the same layer as a driving channel of the driving transistor.

9. The OLED display of claim 8, further comprising:
a gate insulating layer formed over the substrate; and
an interlayer insulating layer formed over the gate insulating layer, wherein the contact hole is formed in the interlayer insulating layer, and wherein the shield channel is formed in and covered by the gate insulating layer.

10. An organic light-emitting diode (OLED) display, comprising:
a substrate;
a data line formed over the substrate and configured to provide a data voltage;
a driving voltage line formed over the substrate and configured to provide a driving voltage;
a driving transistor including a driving gate electrode electrically connected to the driving voltage line; and
a conductive layer interposed between the substrate and the data line,
wherein the driving voltage line is electrically connected to the conductive layer via a contact hole formed between the driving gate electrode and the data line, wherein the driving voltage line includes a portion extended in a first direction where the driving transistor is formed, and wherein the conductive layer is extended in a second direction across from the first direction.

11. The OLED display of claim 10, wherein a portion of the driving voltage line is formed in the contact hole and configured to shield a parasitic capacitance formed between the data line and the driving gate electrode.

12. The OLED display of claim 10, wherein the conductive layer includes a shield gate electrode formed on the same layer as the driving gate electrode, and wherein the driving voltage line is directly connected to the shield gate electrode via the contact hole.

13. The OLED display of claim 12, wherein the shield gate electrode and the driving gate electrode are formed on the same layer.

14. The OLED display of claim 10, wherein the conductive layer includes a shield channel formed on the same layer as a driving channel of the driving transistor, and wherein the driving voltage line is electrically connected to the shield channel via the contact hole.

15. The OLED display of claim 14, wherein the shield channel and the driving gate electrode are formed on different layers.

16. The OLED display of claim 15, further comprising a gate insulating layer formed over the shield channel, wherein the driving gate electrode is formed over the gate insulating layer.

17. The OLED display of claim 16, wherein the contact hole is further formed in the gate insulating layer.

18. An organic light-emitting diode (OLED) display, comprising:
a substrate;
a data line formed over the substrate and configured to provide a data voltage;
a driving voltage line formed over the substrate and configured to provide a driving voltage, wherein the driving voltage line includes a first portion and a second portion;
a driving transistor including a driving channel and a driving gate electrode electrically connected to the driving voltage line;
a shield gate electrode formed on the same layer as the driving gate electrode; and
a shield channel formed on the same layer as the driving channel,
wherein the first portion of the driving voltage line is connected to the shield gate electrode via a first contact hole, and wherein the second portion of the driving voltage line is connected to the shield channel via a second contact hole.

19. The OLED display of claim 18, further comprising:
a scan line formed over the substrate and configured to provide a scan signal; and
a switching transistor electrically connected to the scan line and the data line and including a drain electrode configured to output the data voltage,
wherein the driving gate electrode of the driving transistor is electrically connected to the drain electrode of the switching transistor.

20. The OLED display of claim 18, wherein the widths of the first and second contact holes become increases with distance from the shield gate electrode.

* * * * *